(12) United States Patent
Liu et al.

(10) Patent No.: US 10,629,629 B2
(45) Date of Patent: Apr. 21, 2020

(54) ARRAY SUBSTRATE AND METHOD FOR MANUFACTURING THE SAME, DISPLAY DEVICE

(71) Applicant: BOE TECHNOLOGY GROUP CO., LTD., Beijing (CN)

(72) Inventors: Yingwei Liu, Beijing (CN); Qi Yao, Beijing (CN); Zhiwei Liang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/041,020

(22) Filed: Jul. 20, 2018

(65) Prior Publication Data
US 2019/0067332 A1    Feb. 28, 2019

(30) Foreign Application Priority Data
Aug. 30, 2017   (CN) .......................... 2017 1 0763072

(51) Int. Cl.
*H01L 27/12*    (2006.01)

(52) U.S. Cl.
CPC ........ *H01L 27/124* (2013.01); *H01L 27/1218* (2013.01); *H01L 27/1262* (2013.01)

(58) Field of Classification Search
CPC ................................................... H01L 27/3262
See application file for complete search history.

(56) References Cited

U.S. PATENT DOCUMENTS

| 5,981,972 | A   | * | 11/1999 | Kawai    | G02F 1/136227 257/59 |
| 9,224,762 | B1  | * | 12/2015 | Li       | H01L 27/1214 |
| 2002/0176032 | A1 | * | 11/2002 | Maeda   | G02F 1/13458 349/43 |
| 2004/0179143 | A1 |   | 9/2004  | Yoo et al. | |
| 2011/0250713 | A1 | * | 10/2011 | Kawasaki | H01L 29/458 438/34 |

(Continued)

FOREIGN PATENT DOCUMENTS

| CN | 202421684 U | 9/2012 |
| CN | 102938394 A | 2/2013 |

(Continued)

OTHER PUBLICATIONS

Office Action dated Jul. 17, 2019 issued in corresponding Chinese Application No. 201710763072.5.

*Primary Examiner* — Thao P Le
(74) *Attorney, Agent, or Firm* — Nath, Goldberg & Meyer; Joshua B. Goldberg; Daniel Bissing (57) ABSTRACT

The present disclosure provides an array substrate, a method for manufacturing the array substrate and a display device. The array substrate includes a base substrate and a signal line provided in a display region at a first side of the base substrate, an electrode is provided at a second side of the base substrate, the second side of the base substrate is opposite to the first side of the base substrate, a via-hole penetrating through the base substrate is provided at a position of the base substrate at which the electrode is provided, a connecting electrode is provided in the via-hole, and the signal line is electrically connected to the electrode provided at the second side of the base substrate through the connecting electrode.

20 Claims, 4 Drawing Sheets

(56) References Cited

U.S. PATENT DOCUMENTS

| | | | |
|---|---|---|---|
| 2013/0009154 A1* | 1/2013 | Choi | .................... H01L 27/124 257/59 |
| 2014/0138717 A1 | 5/2014 | Kong et al. | |
| 2016/0307986 A1* | 10/2016 | Gai | ......................... H01L 21/77 |
| 2017/0352534 A1* | 12/2017 | Liu | ................... H01L 21/02304 |

FOREIGN PATENT DOCUMENTS

| | | |
|---|---|---|
| CN | 104932767 A | 9/2015 |
| CN | 106384740 A | 2/2017 |
| CN | 106409796 A | 2/2017 |
| CN | 106684155 A | 5/2017 |

\* cited by examiner

ARRAY SUBSTRATE AND METHOD FOR MANUFACTURING THE SAME, DISPLAY DEVICE

CROSS-REFERENCE TO RELATED APPLICATION

The present disclosure claims priority to the Chinese patent application No. 201710763072.5, filed on Aug. 30, 2017, the entire contents of which are incorporated herein by reference.

TECHNICAL FIELD

The present disclosure relates to the technical field of display technology, and particularly, to an array substrate and a method for manufacturing the array substrate, a display device and a method for manufacturing the display device.

BACKGROUND

A display device includes an array substrate, and gate lines and data lines are provided in the array substrate. An external integrated circuit (IC) to be electrically connected to the array substrate is electrically connected to the gate lines and the data lines in a bonding region so as to output control signals to the gate lines and the data lines.

Currently, lead wires are required to be provided in an edge region of a display panel for the gate lines and the data lines, so as to electrically connect to the external integrated circuit in the bonding region, thus it is required to reserve a bezel with a certain width at an edge of the display panel, thereby the display panel cannot be achieved with a narrow bezel or without any bezel.

SUMMARY

Embodiments of the present disclosure provide an array substrate including a base substrate and a signal line provided in a display region at a first side of the base substrate, an electrode is provided at a second side of the base substrate, the second side of the base substrate is opposite to the first side of the base substrate, a via-hole penetrating through the base substrate is provided at a position of the base substrate at which the electrode is provided, a connecting electrode is provided in the via-hole, and the signal line is electrically connected to the electrode provided at the second side of the base substrate through the connecting electrode.

In some implementations, the signal line includes a gate line, the electrode provided at the second side of the base substrate includes a first electrode, the via-hole includes a first via-hole, the first via-hole is provided at a position of the base substrate at which the first electrode is provided, and the gate line is electrically connected to the first electrode through the connecting electrode in the first via-hole.

In some implementations, the signal line includes a data line, the electrode provided at the second side of the base substrate includes a second electrode, the via-hole includes a second via-hole, the second via-hole is provided at a position of the base substrate at which the second electrode is provided, and the data line is electrically connected to the second electrode through the connecting electrode in the second via-hole.

In some implementations, the connecting electrode is formed of a material which is the same as that of the signal line.

In some implementations, the electrode provided at the second side of the base substrate is at least partially embedded in the base substrate.

In some implementations, a driving circuit of the display region is further provided at the first side of the base substrate, and the driving circuit of the display region is electrically connected to the electrode provided at the second side of the base substrate through the connecting electrode in the via-hole.

In some implementations, an external integrated circuit to be connected to the array substrate is provided at the second side of the base substrate, and the electrode provided at the second side of the base substrate is electrically connected to the external integrated circuit.

In some implementations, the base substrate is an etchable glass substrate or a flexible high temperature resistant substrate.

In some implementations, the base substrate is a flexible polyimide resin substrate.

In some implementations, the signal line includes a touch electrode line.

Embodiments of the present disclosure further provide a method for manufacturing an array substrate, including steps of: forming a base substrate; forming a signal line in a display region at a first side of the base substrate; forming an electrode at a second side of the base substrate, the second side of the base substrate is opposite to the first side of the base substrate; forming a via-hole penetrating through the base substrate at a position of the base substrate at which the electrode is provided; and forming a connecting electrode in the via-hole, and the signal line is electrically connected to the electrode provided at the second side of the base substrate through the connecting electrode.

In some implementations, the signal line includes a gate line, the electrode provided at the second side of the base substrate includes a first electrode, the via-hole includes a first via-hole, the step of forming the via-hole penetrating through the base substrate includes: forming the first via-hole at a position of the base substrate at which the first electrode is provided, and the gate line is electrically connected to the first electrode through the connecting electrode in the first via-hole.

In some implementations, the signal line includes a data line, the electrode provided at the second side of the base substrate includes a second electrode, the via-hole includes a second via-hole, and the step of forming the via-hole penetrating through the base substrate includes: forming the second via-hole at a position of the base substrate at which the second electrode is provided, and the data line is electrically connected to the second electrode through the connecting electrode in the second via-hole.

Embodiments of the present disclosure further provide a method for manufacturing an array substrate, including steps of: providing a rigid base substrate; forming a buffer layer on the rigid base substrate; forming an electrode on the buffer layer; forming a flexible base layer covering the electrode; forming a via-hole at a position of the flexible base layer at which the electrode is provided, so as to expose the electrode; and forming a connecting electrode in the via-hole and simultaneously forming a signal line in a display region on the flexible base layer, and the signal line is electrically connected to the electrode formed on the buffer layer through the connecting electrode.

In some implementations, the signal line includes a gate line, the electrode provided on the buffer layer includes a first electrode, the via-hole includes a first via-hole, the step of forming the connecting electrode in via-hole and simultaneously forming the signal line in the display region on the flexible base layer includes: by a single patterning process, forming the connecting electrode in first via-hole and simultaneously forming the gate line in the display region on the flexible base layer, the gate line is electrically connected to the first electrode through the connecting electrode in the first via-hole.

In some implementations, the signal line includes a data line, the electrode provided on the buffer layer includes a second electrode, the via-hole includes a second via-hole, the step of forming the connecting electrode in via-hole and simultaneously forming the signal line in the display region on the flexible base layer includes: by a single patterning process, forming the connecting electrode in second via-hole and simultaneously forming the data line in the display region on the flexible base layer, the data line is electrically connected to the second electrode through the connecting electrode in the second via-hole.

In some implementations, the method further includes: dipping the buffer layer in a solution capable of dissolving the buffer layer, so as to remove the rigid base substrate.

In some implementations, the buffer layer is formed of zinc oxide, and the solution capable of dissolving the buffer layer is a solution of hydrogen chloride.

In some implementations, the electrode provided on the buffer layer is at least partially embedded in the flexible base layer.

Embodiments of the present disclosure further provide a display device including the array substrate described above.

The present disclosure further provides a method for manufacturing the display device, including the method for manufacturing the array substrate described above.

DETAILED DESCRIPTION

In order to make person skilled in the art understand the present disclosure better, the array substrate and the method for manufacturing the array substrate, the display device and the method for manufacturing the display device provided by the present disclosure will be described in detail below in conjunction with the drawings.

Figure 1:
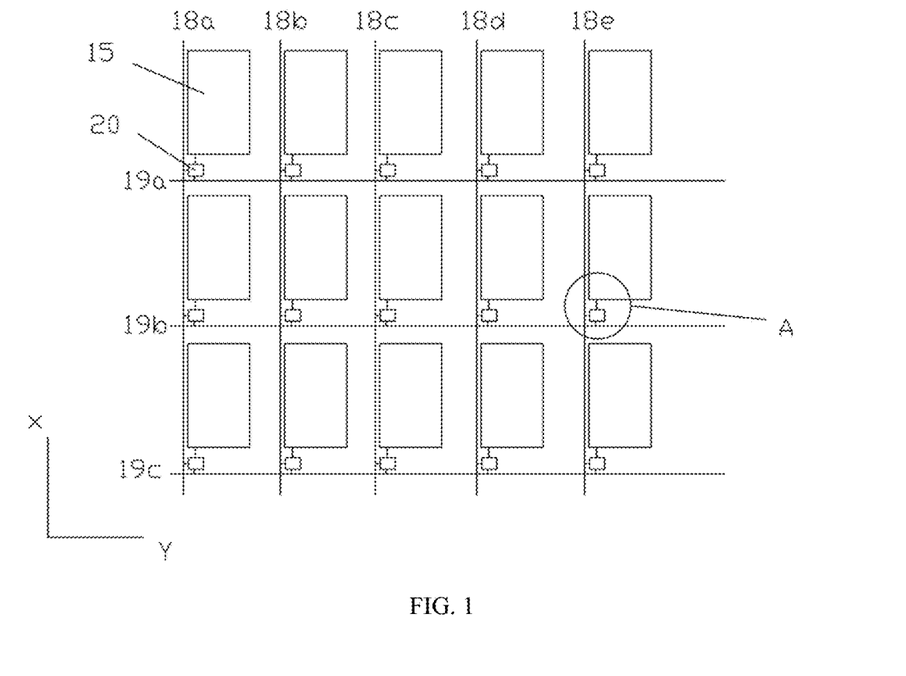
FIG. 1 shows a plan diagram of a first side of a base substrate of an array substrate in an embodiment of the present disclosure.
Figure 3:
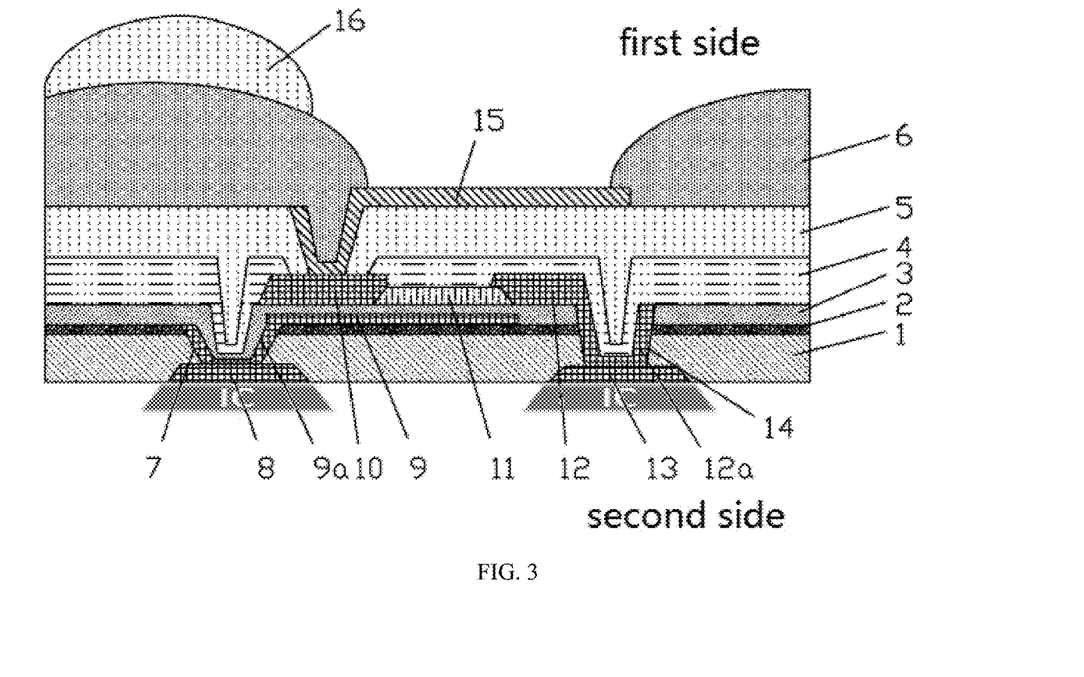
FIG. 3 shows a sectional diagram of an array substrate, in which a gate line and a data line provided at a first side of the array substrate are each connected to an electrode provided at a second side of the array substrate, in an embodiment of the present disclosure.

Referring to FIGS. 1 and 3, the array substrate in an embodiment of the present disclosure includes a base substrate 1 and signal lines provided in a display region at a first side of the base substrate 1. The signal lines include a plurality of gate lines and a plurality of data lines, which intersect with each other. FIG. 1 shows the gate lines 19a through 19c and the data lines 18a through 18e. As shown in FIG. 3, electrodes are provided at a second side of the base substrate 1, the second side of the base substrate 1 is opposite to the first side of the base substrate 1, the electrodes includes a first electrode 8 and a second electrode 13, a first via-hole 7 penetrating through the base substrate 1 is provided at a position of the base substrate 1 at which the first electrode 8 is provided, a second via-hole 14 penetrating through the base substrate 1 is provided at a position of the base substrate 1 at which the second electrode 13 is provided, a first connecting electrode 9a is provided in the first via-hole 7, a second connecting electrode 12a is provided in the second via-hole 14, the first connecting electrode 9a in the first via-hole 7 is electrically connected to the first electrode 8, and the second connecting electrode 12a in the second via-hole 14 is electrically connected to the second electrode 13. As an example, the gate line is electrically connected to the first electrode 8 through the first connecting electrode 9a in the first via-hole 7, and the data line is electrically connected to the second electrode 13 through the second connecting electrode 12a in the second via-hole 14.

The first electrode 8 and the second electrode 13 are respectively configured to electrically connect the gate line and the data line to an external integrated circuit which is provided at the second side of the base substrate 1 and to be connected to the array substrate, thus it is not required to provide lead wires at an edge of the array substrate for electrically connecting the gate line and the data line to the external integrated circuit, which can reduce a size of a bezel reserved at the edge of the array substrate, or it is not required to reserve the bezel, thereby a narrow bezel or no bezel can be achieved.

Figure 2:
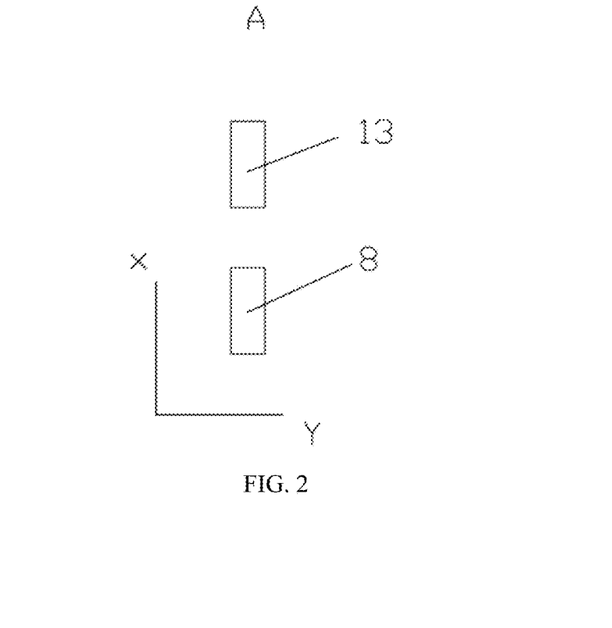
FIG. 2 shows an arrangement diagram of electrodes provided at a second side of the base substrate.

FIG. 2 shows an arrangement diagram of the electrodes provided at the second side of the base substrate. As shown in FIG. 2, X direction indicates an extending direction of the data line, Y direction indicates an extending direction of the gate line, and the first electrode 8 and the second electrode 13 are arranged successively along the extending direction of the data line (i.e., X direction). FIG. 3 shows a sectional diagram of A region of FIG. 1 taken along the extending direction of the data line.

In some implementations, the gate line is electrically connected to a gate of a thin film transistor, and the data line is electrically connected to a source of the thin film transistor.

As shown in FIG. 1, a pixel electrode 15 and a thin film transistor 20 are provided nearby an intersection position of the gate line and the data line, the gate line is electrically connected to the gate of the thin film transistor 20, and the data line is electrically connected to the source of the thin film transistor 20. As shown in FIG. 3, each thin film transistor 20 is connected to one gate line and one data line. For example, the thin film transistor 20 in the A region of FIG. 1 is connected to the data line 18e and the gate line 19b respectively.

In some implementations, the first electrode 8 and the second electrode 13 are provided at positions close to the thin film transistor.

In some implementations, as shown in FIG. 3, the thin film transistor 20 includes a buffer layer 2, a gate 9, a gate insulating layer 3, an active layer 11, a drain 10 and a source 12, which are successively provided at the first side of the base substrate 1, the first via-hole 7 is provided at the position at which the first electrode 8 is provided, and penetrates through the base substrate 1 and the buffer layer 2, the second via-hole 14 is provided at the position at which the second electrode 13 is provided, and penetrates through the base substrate 1, the buffer layer 2 and the gate insulating layer 3. By taking the thin film transistor in A region of FIG. 1 as example, the gate 9 is electrically connected to the gate line 19b, and the gate line 19b is electrically connected to the first connecting electrode 9a in the first via-hole 7 so as to further electrically connect to the first electrode 8 by the first connecting electrode 9a successively penetrating through the buffer layer 2 and the base substrate 1. The gate line 19b is electrically connected to the first electrode 8 through the first connecting electrode 9a in the first via-hole 7, thus a flatness of the array substrate to be formed will not be affected. In practical applications, the buffer layer 2 may be provided or omitted as required. The drain 10 is configured to electrically connect to the pixel electrode 15. Also by taking the thin film transistor in A region of FIG. 1 as example, the source 12 is electrically connected to the data line 18e, and the data line 18e is electrically connected to the second electrode 13 by the second connecting electrode 12a successively penetrating through the gate insulating layer 3, the buffer layer 2 and the base substrate 1. The data line 18e is electrically connected to the second electrode 13 through the second connecting electrode 12a in the second via-hole 14, thus the flatness of the array substrate to be formed will not be affected.

It should be noted that, in the embodiment, by taking the thin film transistor in A region of FIG. 1 as example, the gate line 19b and the data line 18e are respectively electrically connected to the gate 9 and the source 12 of the single thin film transistor, but the present disclosure is not limited thereto. In practical applications, the gate line 19b and the data line 18e may be electrically connected to different thin film transistors respectively.

Figure 4:
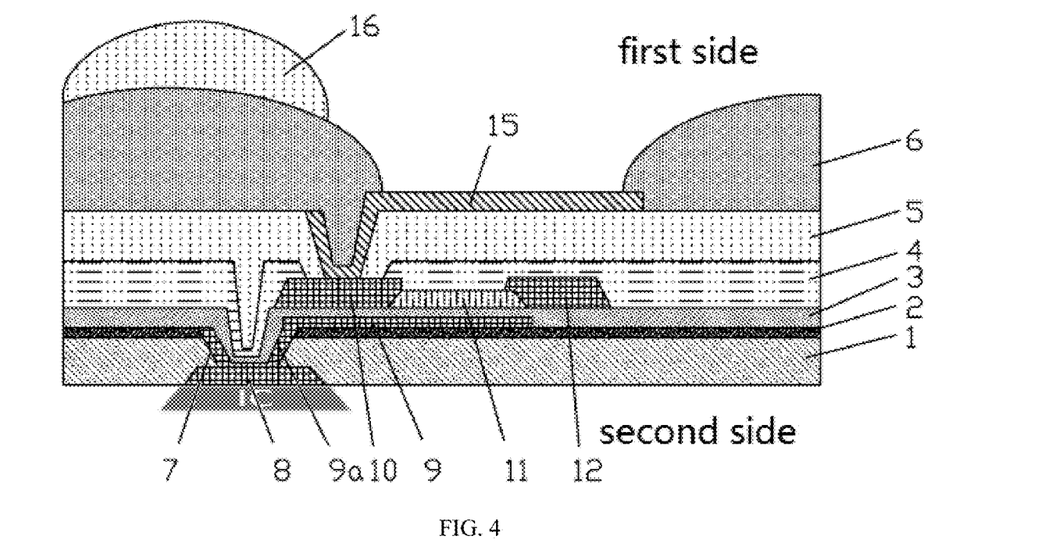
FIG. 4 shows a sectional diagram of an array substrate, in which a gate line provided at a first side of the array substrate is connected to a first electrode provided at a second side of the array substrate, in an embodiment of the present disclosure.
Figure 5:
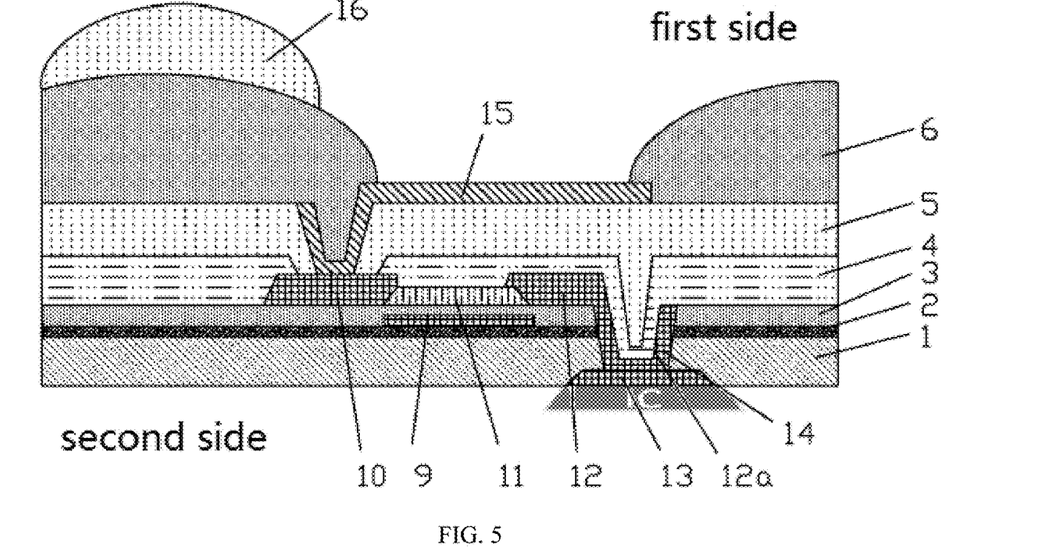
FIG. 5 shows a sectional diagram of an array substrate, in which a data line provided at a first side of the array substrate is connected to a second electrode provided at a second side of the array substrate, in an embodiment of the present disclosure.

Further, in the embodiment, both the gate line and the data line provided at the first side of the base substrate 1 are electrically connected to the electrodes provided at the second side of the base substrate 1, but the present disclosure is not limited thereto. In practical applications, it is possible that only the gate line provided at the first side of the base substrate 1 is electrically connected to the electrode provided at the second side of the base substrate 1, and in this case, the array substrate may have a structure as shown in FIG. 4. Alternatively, it is also possible that only the data line provided at the first side of the base substrate 1 is electrically connected to the electrode provided at the second side of the base substrate 1, and in this case, the array substrate may have another structure as shown in FIG. 5.

It also should be noted that, the quantity of thin film transistors connected to each gate line and/or each data line may be set as required, which is not limited by the present disclosure.

In some implementations, the first connecting electrode 9a is formed of a material the same as that of the gate 9 and/or the gate line 19b, and the second connecting electrode 12a is formed of a material the same as that of the source 12 and/or the data line 18e.

In some implementations, in order to ensure that a thickness of the array substrate will not be affected, both the first electrode 8 and the second electrode 13 are at least partially embedded in the base substrate 1. For example, both the first electrode 8 and the second electrode 13 may be completely embedded in the base substrate 1, i.e., surfaces of the first electrode 8 and the second electrode 13 facing toward a same direction as the second side of the base substrate 1 are flush with the second side of the base substrate 1. Again, for example, both the first electrode 8 and the second electrode 13 may be partially embedded in the base substrate 1, i.e., the surfaces of the first electrode 8 and the second electrode 13 facing toward the same direction as the second side of the base substrate 1 protrude from the second side of the base substrate 1.

It should be understood that, both the first electrode 8 and the second electrode 13 may be completely provided on the second side of the base substrate 1, i.e., not embedded in the base substrate 1.

In some implementations, a driving circuit (not shown in the drawings) of the display region is further provided at the first side of the base substrate 1, and the driving circuit of the display region is also electrically connected to the electrode provided at the second side of the base substrate 1 by the connecting electrode in the via-hole penetrating through the base substrate 1.

In some implementations, an external integrated circuit to be connected to the array substrate is provided at the second side of the base substrate 1, and the electrode provided at the second side of the base substrate 1 is electrically connected to the external integrated circuit. Thus, a bonding region for providing the external integrated circuit can be transferred to the second side of the base substrate 1, which facilitates the gate line, the data line and the driving circuit of the display region to electrically connect to the external integrated circuit provided at the second side of the base substrate 1 through the electrodes provided at the second side of the base substrate 1.

In practical applications, the base substrate 1 is an etchable glass substrate or a flexible high temperature resistant substrate, and for example, the base substrate 1 may be a flexible polyimide resin substrate, which facilitates to provide the via-hole in the base substrate 1.

In the embodiment, the array substrate further includes a passivation layer 4, a first planarization layer 5, the pixel electrode 15, a second planarization layer 6 and a separation pillar 16, which are successively provided above the drain 10 and the source 12. Certainly, in practical applications, corresponding films may be added or omitted as required.

It should be noted that, although the signal lines in the embodiment include the gate lines and the data lines, the present disclosure is not limited thereto. In practical applications, the signal lines may further include a touch electrode line and so on.

By providing the electrodes at the second side of the base substrate 1 and electrically connecting the signal lines provided at the first side of the base substrate 1 to the electrodes provided at the second side of the base substrate 1 via connecting electrodes in via-holes penetrating through the base substrate 1, the signal lines provided at the first side of the base substrate 1 can be electrically connected to the external integrated circuit provided at the second side of the base substrate 1 through the electrodes provided at the second side of the base substrate 1, thus a narrow bezel or no bezel can be achieved.

An embodiment of the present disclosure provides a method for manufacturing an array substrate, including steps of: forming a base substrate 1; forming a signal line in a display region at a first side of the base substrate 1; forming an electrode at a second side of the base substrate 1, the second side of the base substrate 1 is opposite to the first side of the base substrate 1; forming a via-hole penetrating through the base substrate 1 at a position of the base substrate 1 at which the electrode is provided; and forming a connecting electrode in the via-hole, and the signal line is electrically connected to the electrode provided at the second side of the base substrate 1 through the connecting electrode in the via-hole.

In some implementations, the signal line includes a gate line and a data line which intersect with each other, the electrode provided at the second side of the base substrate 1 includes a first electrode and a second electrode, the via-hole includes a first via-hole and a second via-hole, and the step of forming the via-hole penetrating through the base substrate 1 at the position at which the electrode provided at the second side of the base substrate 1 is provided includes: forming the first via-hole at a position of the base substrate 1 at which the first electrode is provided, and forming the second via-hole at a position of the base substrate 1 at which the second electrode is provided, the gate line is electrically connected to the first electrode through the connecting electrode in the first via-hole, and the data line is electrically connected to the second electrode through the connecting electrode in the second via-hole.

An embodiment of the present disclosure provides a method for manufacturing an array substrate, including steps of: providing a rigid base substrate; forming a buffer layer on the rigid base substrate; forming an electrode on the buffer layer; forming a flexible base layer covering the electrode; forming a via-hole penetrating through the flexible base layer at a position at which the electrode is provided, so as to expose the electrode; and forming a connecting electrode in the via-hole, and simultaneously forming a signal line in a display region on the flexible base layer, the signal line is electrically connected to the electrode formed on the buffer layer through the connecting electrode in the via-hole penetrating through the flexible base layer.

In some implementations, the signal line includes a gate line and a data line which intersect with other, the electrode formed on the buffer layer includes a first electrode and the second electrode, the via-hole includes a first via-hole and a second via-hole, the step of forming the connecting electrode in the via-hole and simultaneously forming the signal line in the display region on the flexible base layer includes: by a single patterning process, forming a first connecting electrode in the first via-hole and simultaneously forming the gate line in the display region on the flexible base layer, the gate line is electrically connected to the first electrode through the first connecting electrode in the first via-hole; and by a single patterning process, forming a second connecting electrode in the second via-hole and simultaneously forming the data line in the display region on the flexible base layer, the data line is electrically connected to the second electrode through the second connecting electrode in the second via-hole.

Forming the first connecting electrode in the first via-hole and the gate line by a single patterning process and forming the second connecting electrode in the second via-hole and the data line by a single patterning process can simplify process, reduce the quantity of masks to be used, thereby can reduce a cost of the process.

By providing the electrode at the second side of the flexible base layer and electrically connecting the signal line provided at the first side of the flexible base layer to the electrode provided at the second side of the flexible base layer via the connecting electrode in the via-hole penetrating through the flexible base layer, the signal line provided at the first side of the flexible base layer can be electrically connected to the external integrated circuit provided at the second side of the flexible base layer through the electrode provided at the second side of the flexible base layer, thus a narrow bezel or no bezel can be achieved.

In some implementations, a gate of a thin film transistor is electrically connected to the gate line, and the gate line is electrically connected to the first electrode through the first connecting electrode in the first via-hole, a source of the thin film transistor is electrically connected to the data line, and the data line is electrically connected to the second electrode through the second connecting electrode in the second via-hole.

A specific implementation of a method for manufacturing an array substrate is described in detail below. In such implementation, a thin film transistor is provided nearby an intersection position of a gate line and a data line, and the thin film transistor is connected to the gate line and the data line.

Referring to FIGS. 6A through 6F, the method for manufacturing the array substrate includes following steps.

Figure 6A:
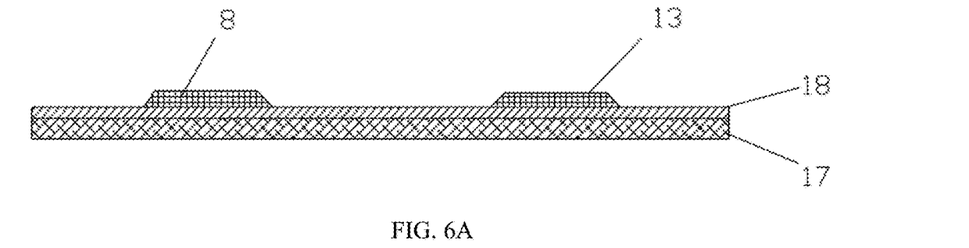
FIG. 6A shows a first process of a method for manufacturing an array substrate in an embodiment of the present disclosure.

As shown in FIG. 6A, forming a rigid base substrate 17, forming a first buffer layer 18 on the rigid base substrate 17, and forming electrodes on the first buffer layer 18, the electrodes include the first electrode 8 and the second electrode 13.

Figure 6B:
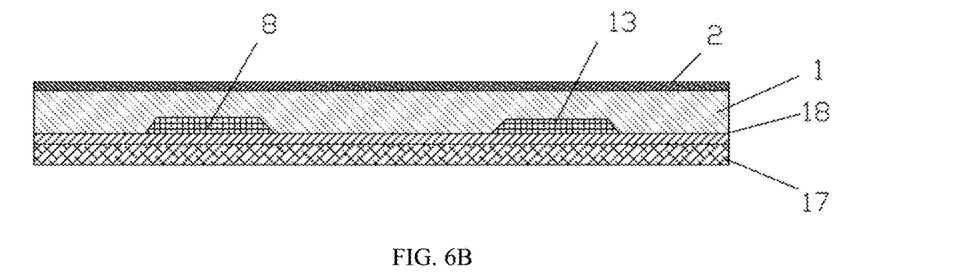
FIG. 6B shows a second process of a method for manufacturing an array substrate in an embodiment of the present disclosure.

As shown in FIG. 6B, a flexible base layer 1 and a second buffer layer 2, which cover the first buffer layer 18 and the electrodes, are formed.

Figure 6C:
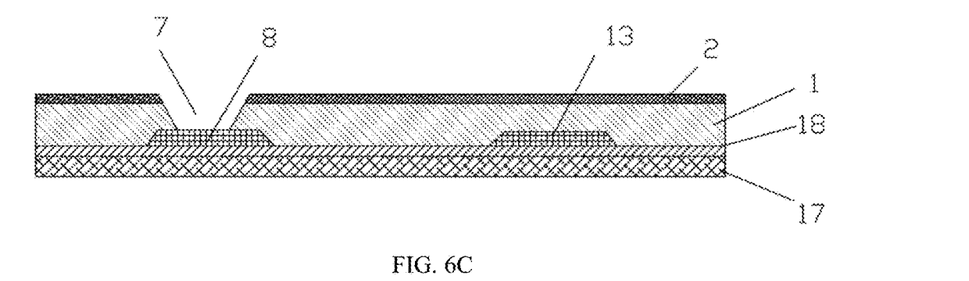
FIG. 6C shows a third process of a method for manufacturing an array substrate in an embodiment of the present disclosure.

As shown in FIG. 6C, a first via-hole 7 penetrating through the flexible base layer 1 and the second buffer layer 2 is formed at a position at which the first electrode 8 is provided.

Figure 6D:
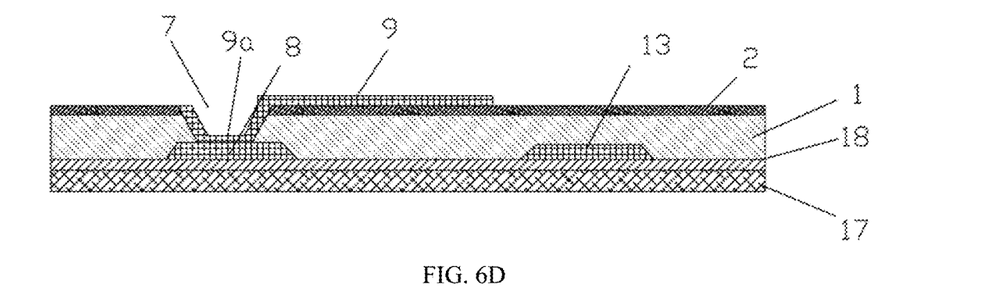
FIG. 6D shows a fourth process of a method for manufacturing an array substrate in an embodiment of the present disclosure.

As shown in FIG. 6D, by a single patterning process, forming a gate 9 on the second buffer layer 2 and simultaneously forming a first connecting electrode 9a in the first via-hole 7, the gate 9 is connected to the gate line, and the gate line is electrically connected to the first connecting electrode 9a in the first via-hole 7 so as to electrically connect the first electrode 8 through the first connecting electrode 9a in the first via-hole 7.

Figure 6E:
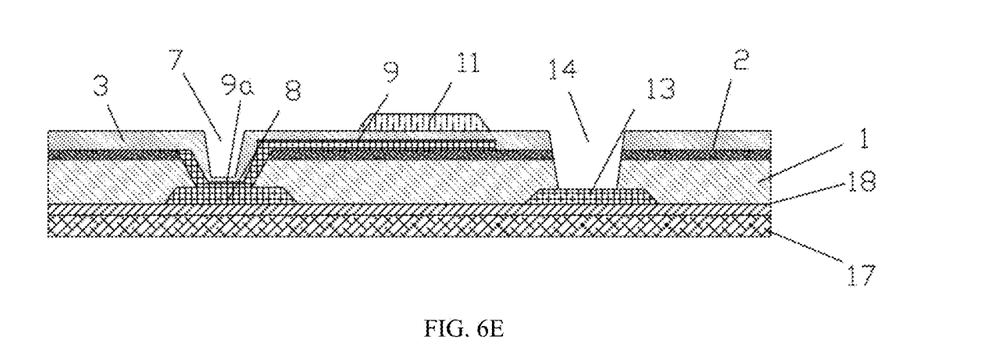
FIG. 6E shows a fifth process of a method for manufacturing an array substrate in an embodiment of the present disclosure.

As shown in FIG. 6E, forming a gate insulating layer 3 covering the second buffer layer 2, the gate 9 and the first connecting electrode 9a, forming an active layer 11 on the gate insulating layer 3, and forming a second via-hole 14 penetrating through the gate insulating layer 3, the second buffer layer 2 and the flexible base layer 1.

Figure 6F:
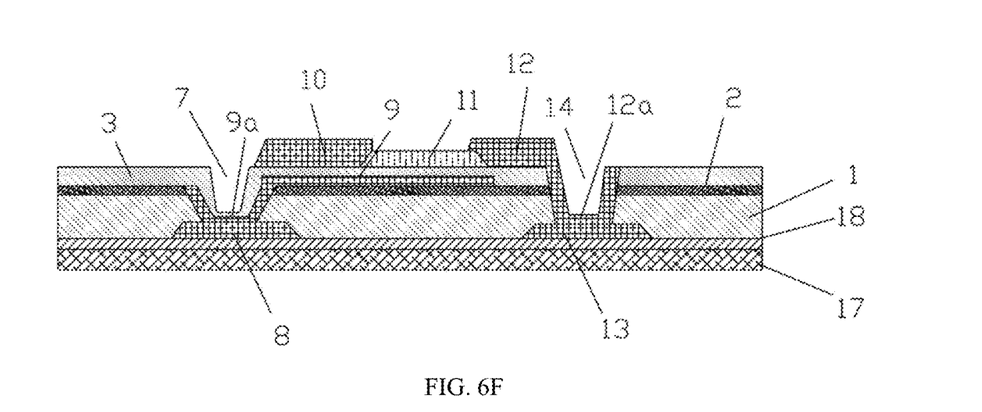
FIG. 6F shows a sixth process of a method for manufacturing an array substrate in an embodiment of the present disclosure.

As shown in FIG. 6F, by a single patterning process, forming a drain 10 and a source 12 on the gate insulating layer 3 and simultaneously forming a second connecting electrode 12a in the second via-hole 14, the source 12 is connected to the data line, and the data line is electrically connected to the second connecting electrode 12a in the second via-hole 14, so as to electrically connect the second electrode 13 through the second connecting electrode 12a in the second via-hole 14.

Subsequently, a passivation layer 4, a first planarization layer 5, a pixel electrode 15, a second planarization layer 6 and a separation pillar 16 may be formed successively to complete the manufacturing of the array substrate, so as to form the array substrate as shown in FIG. 3 (the rigid base substrate 17 and the first buffer layer 18 are not shown in FIG. 3). Certainly, in practical applications, corresponding films may be added or omitted as required. Additionally, the second buffer layer 2 may be provided or omitted as required.

It should be noted that, in the embodiment, the gate line and the data line are electrically connected to the gate 9 and the source 12 of a single thin film transistor respectively, but the present disclosure is not limited thereto. In practical applications, the gate line and the data line may be electrically connected to different thin film transistors respectively.

Additionally, in the embodiment, both the gate line and the data line above the flexible base layer 1 are electrically connected to the electrodes below the flexible base layer 1, but the present disclosure is not limited thereto. In practical applications, it is possible that only the gate line above the flexible base layer 1 is electrically connected to the electrode below the flexible base layer 1, and in this case, the array substrate may have a structure as shown in FIG. 4. Alternatively, it is also possible that only the data line above the flexible base layer 1 is electrically connected to the electrode below the flexible base layer 1, and in this case, the array substrate may have a structure as shown in FIG. 5.

The method for manufacturing the array substrate may further include: dipping the first buffer layer 18 in a solution capable of dissolving the first buffer layer 18, so as to remove the rigid base substrate 17. The first buffer layer 18 may be formed of zinc oxide, and the solution capable of dissolving the first buffer layer 18 may be a solution of hydrogen chloride. The solution of hydrogen chloride may be a dilute solution, and for example, may be a dilute solution in which the content of hydrogen chloride is below 0.5%.

By employing the rigid base substrate 17 and the first buffer layer 18, the rigid base substrate 17 can be used as a supporting body during the manufacturing, and the first buffer layer 18 can be dissolved to remove the rigid base substrate 17 after the array substrate is completely manufactured, thereby requirements for using the flexible base layer are satisfied. For example, the rigid base substrate 17 is a glass substrate.

An embodiment of the present disclosure provides a display device including the array substrate described above.

An embodiment of the present disclosure provides a method for manufacturing the display device, including the method for manufacturing the array substrate described above.

As above, by providing the electrode at the second side of the base substrate or the flexible base layer and electrically connecting the signal line provided at the first side of the base substrate or the flexible base layer to the electrode provided at the second side of the base substrate or the flexible base layer via the connecting electrode in the via-hole penetrating through the base substrate or the flexible base layer, the signal line provided at the first side of the base substrate or the flexible base layer can be electrically connected to the external integrated circuit provided at the second side of the base substrate or the flexible base layer through the electrode provided at the second side of the base substrate or the flexible base layer, thus a narrow bezel or no bezel can be achieved.

It should be noted that, in practical applications, the source and the drain in the embodiments of the present disclosure may be exchanged with each other.

It should be understood that, the above implementations are only exemplary implementations for illustrating the principle of the present disclosure, and the present disclosure is not limited thereto. An ordinary person skilled in the art may make various modifications and variants without departing from the scope of the present disclosure. These modifications and variants should be considered as falling into the protection scope of the present disclosure.

What is claimed is:

1. An array substrate, comprising a base substrate and a signal line provided in a display region at a first side of the base substrate, wherein an electrode is provided at a second side of the base substrate, the second side of the base substrate is opposite to the first side of the base substrate, a via-hole penetrating through the base substrate is provided at a position of the base substrate at which the electrode is provided, a connecting electrode is provided in the via-hole, and the signal line is electrically connected to the electrode provided at the second side of the base substrate through the connecting electrode, wherein
at least a part of the electrode is exposed from the second side of the base substrate and is electrically connected to a circuit located on the second side of the base substrate.

2. The array substrate of claim 1, wherein the signal line comprises a gate line, the electrode provided at the second side of the base substrate comprises a first electrode, the via-hole comprises a first via-hole, the first via-hole is provided at a position of the base substrate at which the first electrode is provided, and the gate line is electrically connected to the first electrode through the connecting electrode in the first via-hole.

3. The array substrate of claim 1, wherein the signal line comprises a data line, the electrode provided at the second side of the base substrate comprises a second electrode, the via-hole comprises a second via-hole, the second via-hole is provided at a position of the base substrate at which the second electrode is provided, and the data line is electrically connected to the second electrode through the connecting electrode in the second via-hole.

4. The array substrate of claim 1, wherein the connecting electrode is formed of a material which is the same as that of the signal line.

5. The array substrate of claim 1, wherein the electrode provided at the second side of the base substrate is at least partially embedded in the base substrate.

6. The array substrate of claim 1, wherein the base substrate is an etchable glass substrate or a flexible high temperature resistant substrate.

7. The array substrate of claim 1, wherein the base substrate is a flexible polyimide resin substrate.

8. A method for manufacturing an array substrate, comprising steps of:
forming a base substrate;

forming a signal line in a display region at a first side of the base substrate;

forming an electrode at a second side of the base substrate, the second side of the base substrate is opposite to the first side of the base substrate;

forming a via-hole penetrating through the base substrate at a position of the base substrate at which the electrode is provided;

forming a connecting electrode in the via-hole, and the signal line is electrically connected to the electrode provided at the second side of the base substrate through the connecting electrode; and forming a circuit on the second side of the base substrate, wherein at least a part of the electrode is exposed from the second side of the base substrate and is electrically connected to the circuit.

9. The method of claim 8, wherein the signal line comprises a gate line, the electrode provided at the second side of the base substrate comprises a first electrode, the via-hole comprises a first via-hole, the step of forming the via-hole penetrating through the base substrate comprises:

forming the first via-hole at a position of the base substrate at which the first electrode is provided, and the gate line is electrically connected to the first electrode through the connecting electrode in the first via-hole.

10. The method of claim 8, wherein the signal line comprises a data line, the electrode provided at the second side of the base substrate comprises a second electrode, the via-hole comprises a second via-hole, and the step of forming the via-hole penetrating through the base substrate comprises:

forming the second via-hole at a position of the base substrate at which the second electrode is provided, and the data line is electrically connected to the second electrode through the connecting electrode in the second via-hole.

11. The method of claim 8, wherein the base substrate is an etchable glass substrate or a flexible high temperature resistant substrate.

12. The method of claim 8, wherein the electrode provided at the second side of the base substrate is at least partially embedded in the base substrate.

13. A method for manufacturing an array substrate, comprising steps of:

providing a rigid base substrate;

forming a buffer layer on the rigid base substrate;

forming an electrode on the buffer layer;

forming a flexible base layer covering the electrode;

forming a via-hole at a position of the flexible base layer at which the electrode is provided, so as to expose the electrode;

forming a connecting electrode in the via-hole and simultaneously forming a signal line in a display region on the flexible base layer, and the signal line is electrically connected to the electrode formed on the buffer layer through the connecting electrode; and forming a circuit on the second side of the base substrate, wherein at least a part of the electrode is exposed from the second side of the base substrate and is electrically connected to the circuit.

14. The method of claim 13, wherein the signal line comprises a gate line, the electrode provided on the buffer layer comprises a first electrode, the via-hole comprises a first via-hole, the step of forming the connecting electrode in via-hole and simultaneously forming the signal line in the display region on the flexible base layer comprises:

by a single patterning process, forming the connecting electrode in first via-hole and simultaneously forming the gate line in the display region on the flexible base layer, the gate line is electrically connected to the first electrode through the connecting electrode in the first via-hole.

15. The method of claim 13, wherein the signal line comprises a data line, the electrode provided on the buffer layer comprises a second electrode, the via-hole comprises a second via-hole, the step of forming the connecting electrode in via-hole and simultaneously forming the signal line in the display region on the flexible base layer comprises:

by a single patterning process, forming the connecting electrode in second via-hole and simultaneously forming the data line in the display region on the flexible base layer, the data line is electrically connected to the second electrode through the connecting electrode in the second via-hole.

16. The method of claim 13, further comprising:

dipping the buffer layer in a solution capable of dissolving the buffer layer, so as to remove the rigid base substrate.

17. The method of claim 16, wherein the buffer layer is formed of zinc oxide, and the solution capable of dissolving the buffer layer is a solution of hydrogen chloride.

18. The method of claim 13, wherein the flexible base layer is a flexible polyimide resin substrate.

19. The method of claim 13, wherein the electrode provided on the buffer layer is at least partially embedded in the flexible base layer.

20. A display device, comprising the array substrate of claim 1.

* * * * *